United States Patent [19]

Merrell

[11] 4,070,629
[45] Jan. 24, 1978

[54] HIGH SPEED TUNING SYSTEM

[75] Inventor: Richard G. Merrell, Darien, Ill.

[73] Assignee: Zenith Radio Corporation, Glenview, Ill.

[21] Appl. No.: 734,483

[22] Filed: Oct. 21, 1976

[51] Int. Cl.² .............................................. H04B 1/16
[52] U.S. Cl. .................................... 325/453; 325/464; 325/470; 358/193
[58] Field of Search ............... 325/335, 453, 464, 468, 325/470, 418–423; 358/191, 193, 195; 334/14–16

[56] References Cited

U.S. PATENT DOCUMENTS

| | | | |
|---|---|---|---|
| 3,913,020 | 10/1975 | Van Anrooy | 325/453 |
| 3,943,449 | 3/1976 | Hendrickson et al. | 325/468 |
| 3,962,640 | 6/1976 | Bomba | 325/421 |

Primary Examiner—Robert L. Griffin
Assistant Examiner—Marc E. Bookbinder
Attorney, Agent, or Firm—Nicholas A. Camasto

[57] ABSTRACT

A two mode tuning system includes counters for determining system tuning by counting the LOF, a channel number comparator comparing the derived channel tuning information with a desired channel number and a PLL including a phase comparator for comparing equality pulses from the channel number comparator with a reference frequency. In the first mode the system tunes to a single frequency and in the second it tunes within a frequency window. Tuning cycle control means initiate the single frequency mode in response to a channel number input or an out-of-window tuning indication and the system switches to the tuning window mode about 200ms later. Initially tuning to the "center of the tuning window" relaxes the AFC requirements for a wide window system. The tuning cycle control means also provide for initially overriding the phase comparator and PLL to drive the oscillator at "full ramp" until system tuning is driven past the frequency corresponding to the input channel number. Then, the single frequency PLL mode is initiated.

8 Claims, 6 Drawing Figures

FIG.1.

FIG. 3. TUNING CYCLE CONTROL 26

FIG. 2.

FIG. 5.
RAMP CONTROL 35

FIG. 4.
PHASE COMPARATOR 40

FIG. 6.

HIGH SPEED TUNING SYSTEM

CROSS REFERENCE TO RELATED PATENT & APPLICATION

This application discloses apparatus similar to that in U.S. Pat. No. 3,961,266 issued June 1, 1976 and identical to that in application Ser. No. 718,746 dated Aug. 30, 1976, both in the name of Akio Tanaka and assigned to Zenith Radio Corporation and both of which are hereby incorporated by reference.

BACKGROUND OF THE INVENTION

The invention relates generally to all-electronic television tuning systems. More particularly it relates to a digital tuning system employing counters in a phase lock loop (PLL) for establishing and maintaining tuning in accordance with a selected channel number. Specifically, the invention is concerned with decreasing channel acquisition time; i.e. the maximum time it takes to tune from any one channel to another. The illustrated embodiment of the invention is a two mode tuning system with a first, single frequency PLL mode and a second, tuning-window-with-AFC mode.

DESCRIPTION OF THE PRIOR ART

U.S. Pat. No. 3,961,266, entitled "Channel Seeking Tuning System," describes a television tuning system with a tuning window. It employs channel number computing circuitry to adjust the television receiver tuner to receive signals within a non-zero frequency interval or tuning window about the picture carrier frequency corresponding to any selected FCC designated channel. The tuning window provides a "quiet space" within which an automatic frequency control circuit (AFC) may operate. Should the transmitted signal disappear for any reason, the system stays tuned within the window. The obvious advantage of such a system is that it permits operations with "off-frequency" carrier signals, while retaining the essential feature of assuring that the displayed channel number is representative of actual system tuning.

The above patent taught a window of $\pm\frac{1}{2}$MHz in its preferred embodiment and an AFC range of $\pm 1$MHz. The AFC range is disproportionately large because there was no way of knowing in which portion of the frequency window an "off-frequency" carrier might be, nor where actual system tuning would be (within the window) when released to AFC. A wider window dictated a correspondingly broader AFC pull-in range to assure that a signal located at one extreme of the window would be "captured."

The copending application mentioned above discloses identical apparatus to that of the preferred embodiment, but has claims directed to wide tuning window systems. In particular a two mode system is disclosed with the first mode being a PLL single frequency tuning mode for tuning to the frequency corresponding to the selected channel number and the second mode being an AFC operating within a tuning window about that frequency. The two mode system enables use of an AFC system with the same range as the tuning window.

In the single frequency mode, the PLL operates to control the ramp speed, i.e. how rapidly the tuning voltage which controls the oscillator frequency, is changed. Because of the relatively low frequency comparison rate (due to the non-sophisticated logic used in the computer) the PLL system is not as fast as one would like. As described, a system criterion of approximately 200ms channel acquisition time was established as being most desirable since, for all practical purposes, channel changes would appear instantaneous to the viewer, yet enable him to visually determine what programs were being received on each channel as he operated the system to scan the channels. This is accomplished by the system of this invention which includes means for initially forcing full or 100% ramping, until system tuning is driven past the frequency corresponding to the selected channel number. Thereafter the normal PLL operation is allowed to occur. The initial rapid tuning of the system materially shortens channel acquisition time.

SUMMARY OF THE INVENTION

In accordance with the invention, an all-electronic tuning system for rapidly tuning to any television channel, by channel number, includes a voltage controllable oscillator, ramp means supplying tuning voltages to said oscillator, channel computer means deriving channel tuning information from the oscillator frequency, channel number selection means generating desired channel number information, comparison means for comparing selected channel number information with derived channel tuning information and controlling the ramp means to adjust system tuning at a normal rate in accordance with the result of the comparison, and tuning cycle control means, initiated by said channel selection means or system mistuning for controlling said ramp means to drive said tuner and adjust system tuning at a higher rate until system tuning is driven past the frequency corresponding to the selected channel number.

In the specific embodiment chosen for purposes of description, tuning in the first mode is with a digital phase lock loop (PLL) driving the local oscillator to a frequency corresponding to the channel number of the 6MHz FCC-allocated frequency band. In the second mode, frequency window is established about that frequency and the AFC circuit enabled. Channel acquisition time is reduced by initially overriding the phase comparator in the PLL and "full" or "100% ramping" until the desired system frequency is passed. Thereafter normal first mode PLL tuning occurs. It will be appreciated that this invention has no essential relationship with a tuning window and may remain in first mode PLL tuning if so desired.

The novel tuning system of the invention is thus very fast without requiring special logic circuitry or unusual PLL parameters. It is also readily adaptable to any varactor diode tuner.

OBJECTS OF THE INVENTION

An object of this invention is to provide a novel television tuning system.

Another object of this invention is to provide an improved all-electronic all-channel television tuning system.

A further object of this invention is to provide an improved all-channel television tuning system with rapid channel acquisition.

BRIEF DESCRIPTION OF THE DRAWINGS

Further objects and advantages of this invention will be apparent from reading the following specification in conjunction with the drawings in which.

LOGIC DEFINITIONS

For simplicity, only logic connections are shown in the figures and only voltage sources and grounds necessary to establish the logic control signal levels are shown. Positive logic is used throughout and logic gates are generally referred to by their functional names only, i.e., AND, NAND, OR, NOR, and EXCLUSIVE OR. A "1" represents a high logic signal and a "0" corresponds to a lower logic signal. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels. An EXCLUSIVE OR has a 0 at its output only when signals at all inputs are at the same level.

Leads may be identified by the functional signals they carry. For convenience, leads connected to parts in another figure, in addition to their normal designations will, where practical, be followed by the appropriate figure number enclosed in brackets. The additional designation of "FROM" and "TO" indicate the source or destination of logic signals or connections.

The terms "input" and "output" generally indicate a device terminal unless signal is specified. $\phi$ generally represents a timing pulse signal and $\overline{\phi}$ its inverse or complement. If $\phi$ is 0, $\overline{\phi}$ is 1 and vice-versa. The term "inhibit" indicates the condition in which a gate output is no longer dependent upon signals applied to its remaining inputs. The term "enable" designates the condition in which a gate output is dependent upon the signals applied to its remaining inputs.

Flip flops will be referred to by the letters FF. Drawing representations of flip flops are those commonly used with the lead locations indicating the terminal as shown for flip flop 300. The word terminal is omitted in most instances. For example, the "J and K terminals of flip flop 300" will be referred to as "J, K of FF 300". Any unspecified Set (S) or Reset (R) terminals are connected to 0 and all unspecified J or K terminals are connected to 1. All flip flops of the J-K type are similar to RCA tye CD 4027.

DESCRIPTION OF THE PREFERRED EMBODIMENT

GENERAL OPERATION

The system has two tuning modes, characterized as a "single frequency" mode and a "tuning window" mode. It incorporates LOF counters, including a modular scaler, for deriving the channel number corresponding to system tuning, a channel number comparator, a ramp control and tuning voltage source, means for generating desired channel numbers, a reference signal, a phase comparator, an AFC circuit, a channel number display and a tuning cycle control to which the present invention is directed. When a channel number input is made, the system goes into full ramping, senses when the desired frequency has been passed, operates for a fixed time in the single frequency mode (with a PLL) and releases to its tuning window mode with AFC. The invention is directed to the 100% ramping feature, (i.e. driving the varactor controlled oscillator to rapidly change frequency) until an overshoot condition is detected, which shortens the channel acquisition or tuning time.

In the single frequency mode, the PLL is operational and the LOF channel counters continuously count the LOF pulses. The channel number comparator compares the LOF count number with the desired channel number input, supplying an equality pulse Ep to the phase comparator (and resetting the channel counters) each time there is equality. The resetting is done between LOF pulses. The phase comparator is also supplied with a reference timing signal of approximately 1KHz (actual frequency is 976.5625 Hz). The phase comparator compares the frequency and phase of the train of equality pulses from the channel number comparator with the frequency and phase of the 1KHz reference timing signal.

The phase comparator output supplies the ramp control which, in turn, operates on the tuning voltage source for controlling system tuning. If the timing signal reference frequency is higher than the frequency of the train of equality pulses, the LOF is lower than the frequency corresponding to the desired channel number. Similarly, if the frequency of the train of equality pulses is higher than the timing signal reference frequency, the LOF is too high.

The LOF counters are under the control of counting logic. The counter presets are loaded during resetting of the counters between successive LOF pulses, thus insuring that all LOF pulses are counted. During single frequency operation a single residue state of the modular scaler is selected. Thus a comparator equality pulse occurs only when the units and tens counters correspond to the selected channel number tens and units digits and the state of the modular scaler indicates the predetermined residue.

Tuning is complete when LOF is set to the appropriate frequency dictated by the desired channel number supplied to the comparator. No signal is required. When the system has been in its initial single frequency tuning mode for a predetermined time, the counting logic is reconfigured, the system goes into its tuning window mode and the AFC is enabled. The initial-mode time interval is sufficient to insure PLL tuning to the frequency corresponding to the desired channel number.

As fully described in the referent Tanaka patent, the frequency window is conveniently established by asynchronous sampling of the channel counters and specifying more than one acceptable residues or states of the modular scaler. Proper tuning is indicated when the sampled LOF count satisfies the units and tens counters and the preselected residues. System operation in this mode is identical to that described in the copending Tanaka application. The counting logic establishes count, compare and reset intervals for asynchronous sampling of the LOF. The LOF pulses are counted during the count intervals, comparison between the derived channel number count and the selected channel number from the channel number latch is carried out during compare intervals. During reset intervals, the counters are reset and loaded for the next count interval.

If tuning should go outside the window for any reason, or if a channel change initiate (CCI) signal is generated, the tuning cycle control is activated to return the system to full ramping and then to single frequency PLL operation. After the allotted time for single frequency operation, the system again reverts to its normal tuning window mode with AFC control restored.

In the PLL mode the channel number comparator produces an equality pulse for the phase comparator and the phase comparator produces the ramp control voltage for the tuning voltage source. The channel number comparator also sends either an equality or inequality pulse ($Ep$ or $IE$ respectively) to the tuning cycle control. The channel number comparator doesn't directly control the tuning voltage source.

DETAILED DESCRIPTION

Figure 1:
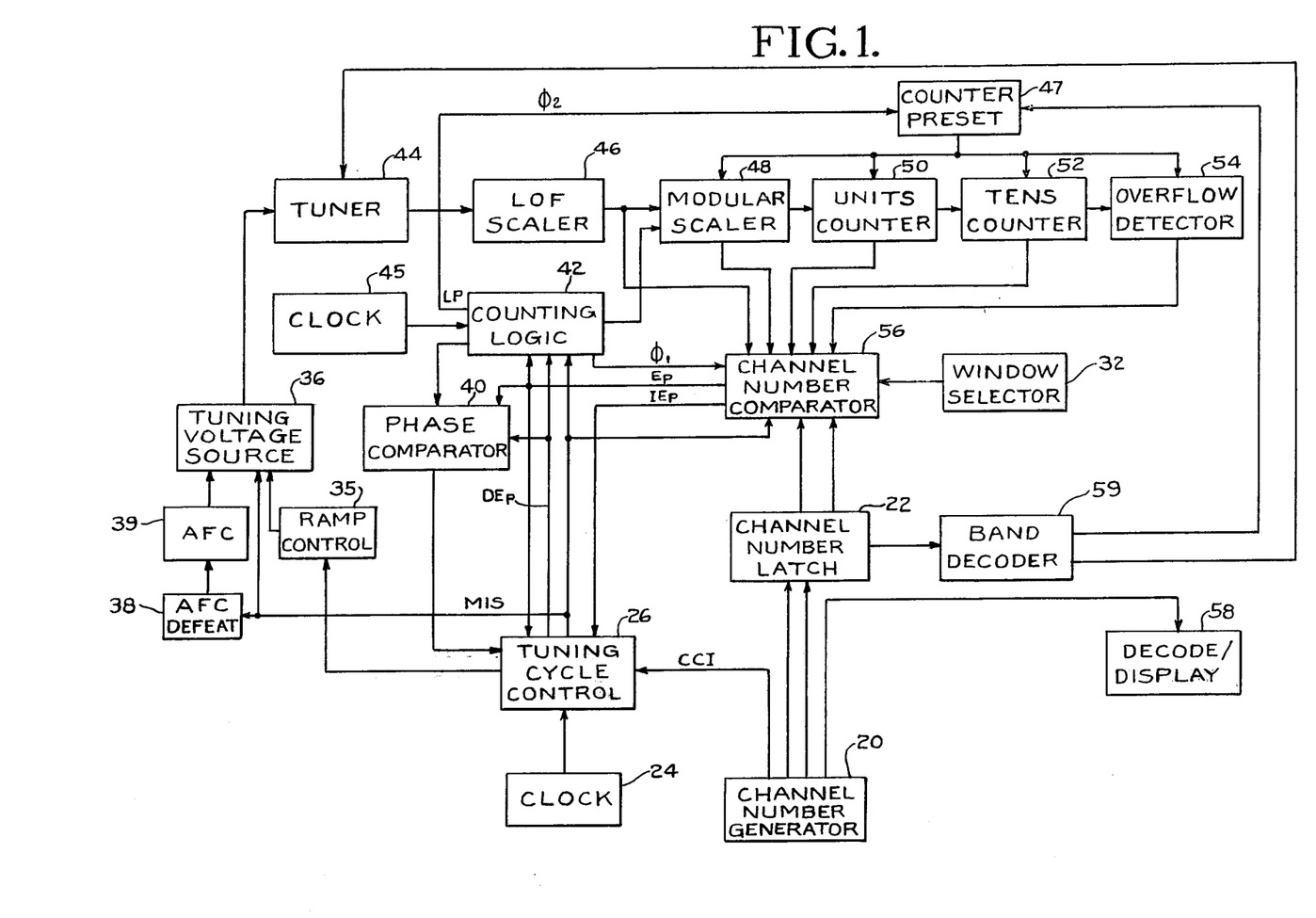
FIG. 1 is a block diagram of the tuning system of the invention.

FIG. 1 is a block diagram of the tuning system constructed in accordance with the invention. A channel number generator 20 includes means for generating a desired two digit channel number for tuning the system. Number generator 20 may include encoding circuitry for producing special binary representations of the channel number in the tuning system and has means for producing a channel change initiate (CCI) signal in response to any channel number input. The generator is coupled to a channel number latch 22, which temporarily stores the input information, and to a tuning cycle control 26 for sequencing the system through its tuning modes. Number generator 20 is also coupled to a Decode/Display dsd58 for displaying the selected channel number.

Number generator 20 may include a keyboard, or a memory system for generating preselected number upon command - either locally or by remote control. A particularly attractive system is described and claimed in copending application Ser. No. 621,911 filed 10-14-75 in the name of Akio Tanaka —now U.S. Pat. No. 4,023,107 — in which a simple number generator is used with an "82×1" memory programmed with simple "stop or go" information. Such a memory is programmed by the user to sequentially produce whatever channel numbers are desired.

Tuning cycle control 26 is coupled to a ramp control 35, a phase comparator 40, and supplies a mode identification signal (MIS) to a tuning voltage source 36, an AFC defeat 38, a counting logic 42, and a channel number comparator 56. A timing signal from clock 24 is supplied to tuning cycle control 26. A source of AFC voltage 39 is coupled between AFC defeat 38 and the tuning voltage source 36 which is also supplied from ramp control 35. Tuning voltage source 36 supplies DC tuning voltages for the local oscillator, mixer and amplifier stage (all not shown) in a tuner 44.

A clock 45 drives counting logic 42, which is coupled to phase comparator 40, a modular scaler 48, a counter preset 47, and channel number comparator 56. Tuner 44 is coupled to a LOF scaler 46 which is in turn coupled to modular scaler 48 and channel number comparator 56. Scaler 48 drives a units counter 40, which drives a tens counter 52, which in turn drives an overflow detector 54. The modular scaler, units and tens counters and overflow detector are often referred to as the LOF counters. Each of scaler 48, units counter 50, tens counter 52 and overflow detector 54 is coupled to channel number comparator 56 and counter preset 47. Channel number latch 22 is coupled to channel number comparator 56 and to a band decoder 59. Band decoder 59 is coupled to counter preset 47 and tuner 44 and supplies presets to the counters based upon the frequency range of the signal corresponding to the selected channel number and an appropriate signal to the tuner for determining VHF or UHF operation. Lastly a simple window selector 32 is coupled to channel number comparator 56.

The LOF scaler is shown in block form since it is well known in the art. In particular, reference may be made to the previously mentioned Tanaka patent. Briefly, the local oscillator frequency is divided by 1024 in the LOF scaler. The divide or scaled LOF output is supplied to a series of interconnected flip flops (not shown) arranged to perform successive division operations to derive the channel number. Each of the counters is serially connected so that the output of each set of flip flops is the input of the next set of flip flops, forming a familiar counter chain.

Because of the 6MHz spacing between adjacent TV channels, (i.e., between the picture carriers of adjacent channels), within each of the four discontinuous television frequency bands, modular six arithmetic becomes of particular significance since a complete cycling of the modular scaler corresponds to a 6MHz change in LOF (i.e. one channel) and each state thus represents a 1MHz interval.

In the preferred embodiment, six cycles of input to the LOF scaler give one cycle of output to the modular scaler, which changes state for each cycle of input. Proper selection of its presets for each band enables its state to consistently reflect incremental tuning within each channel throughout the tuning spectrum. The modular scaler information is supplied as incremental additions to the units counter and adds to its preset count. Similarly, cycling of the units counter drives the tens counter, adding to its preset. The channel number corresponding to system tuning is in the channel number latch (or number generator 20) in binary form and a visible readout may be readily presented to the viewer.

The local oscillator frequency of the tuner is thus divided down by LOF scaler 46, modular scaler 48, and counters 50 and 52 to derive the channel number corresponding to system tuning. The information is supplied to the channel number comparator for comparison with the desired channel number from the channel number latch. Any input of a new desired channel number initiates a tuning cycle and produces a CCI signal.

Clock 45 supplies timing pulses to counting logic circuit 42 for establishing the timing intervals for asynchronous sampling and provides a reference frequency signal for the phase comparator during the single frequency tuning mode. In this mode, the counters count LOF pulses and are reset each time channel number comparator 56 indicates equality between the derived and desired channel numbers. Each time equality is determined an equality pulse is supplied to phase comparator 40 which compares them for phase and frequency coincidence with timing pulses from counting logic 42. Depending upon the result of the phase comparison, ramp control 35 operates on the tuning voltage source to drive tuner 44 in an appropriate direction to minimize the phase comparator error. Single frequency tuning is accomplished by determining one residue of the modular scaler, which in conjunction with the units and tens counters registers equality at only one frequency. The system is tuned at "full speed" until an "overshoot" condition is detected indicating the correct tuning position has been passed. Then a fixed timer period is allocated for operation of the phase lock loop. This time period is determined by clock 24, operating through tuning cycle 26, which controls tuning sequencing.

After the predetermined time allocated for the single frequency mode PLL has elapsed, counting logic circuit 42 reconfigures the counters for asynchronous sampling counting to produce the tuning window mode. The AFC is also enabled in this mode. In the tuning windowed mode timing circuits establish separate count, compare and reset intervals.

In the single frequency mode, channel number comparator 56 compares the derived channel tuning information based upon the LOF, with the desired channel number from the channel number latch on an elapsed time basis. That is each time the desired number is counted a pulse is sent and a comparison of frequency and phase with a reference pulse is made. It thus determines equality between the tens and units digits of the received and desired channel numbers and if the residue of the modular scaler corresponds to the predetermined one. It may also include circuitry, for guarding against an erroneous comparison signal based upon an indeterminate condition which could occur during mode changing.

In the tuning window mode, a derived channel number, representative of actual system tuning is supplied to comparator 56 on a time sample basis where it is compared with the desired channel number from latch 22 during a "compare" interval. During each reset interval the counters are loaded with their preset information in preparation for the next count interval. The Inequality pulse (IE$p$) output of channel number comparator 56 is connected to tuning cycle control 26 and activated during the "compare" interval. As long as the channel number comparator indicates that the tuning frequency is within the window no IE$p$ pulse is produced and the system stays in the tuning window mode. If system tuning goes outside of the window, an inequality pulse is sent to tuning cycle control 26 to reinitiate full ramping and the single frequency tuning mode as though a new channel number input had been made.

AFC 39 is enabled in the tuning window mode, through defeat logic 38, to operate normally; tracking the received signal and maintaining system tuning by supplying any required correction voltage to tuning voltage source 36.

Figures 2, 3:
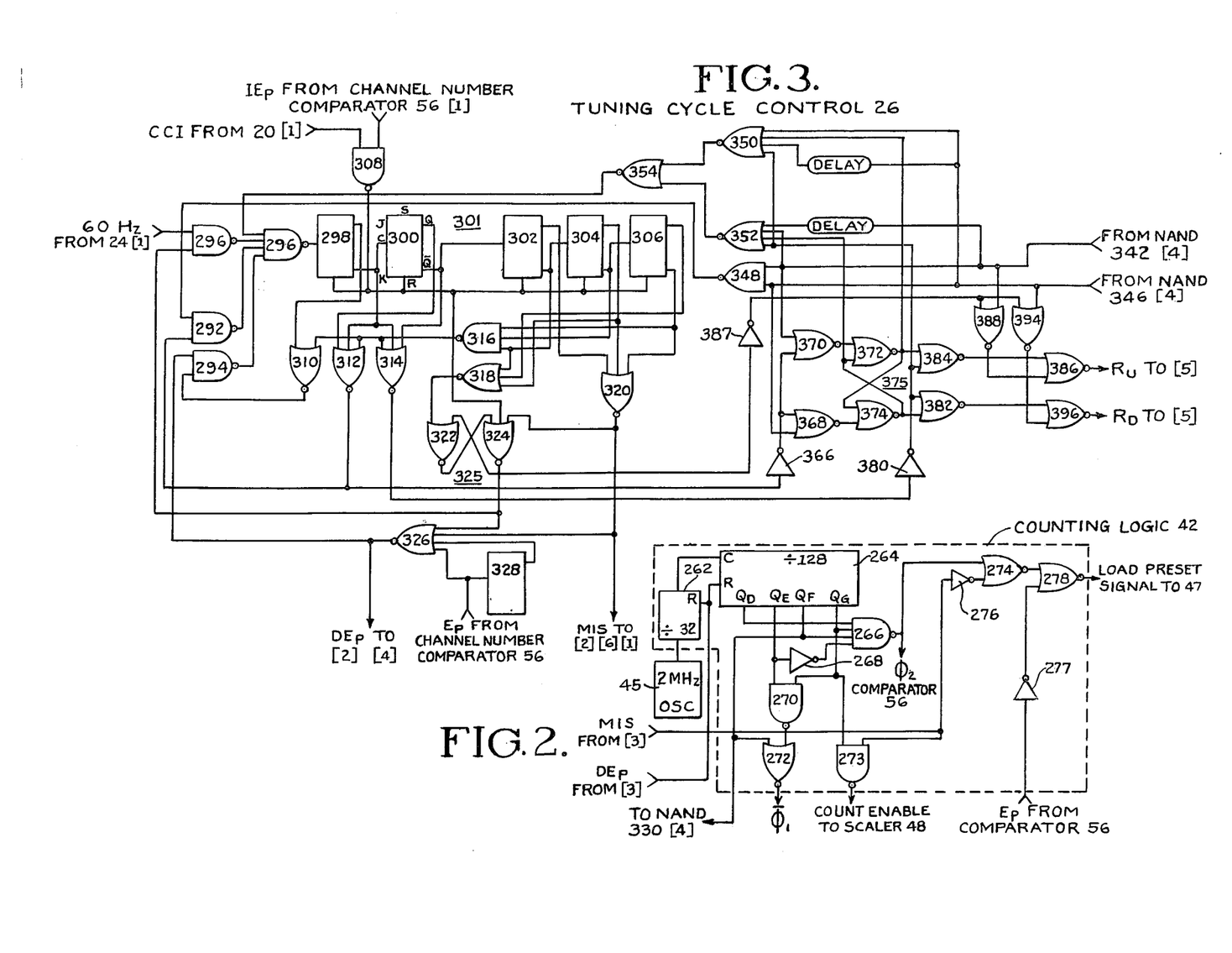
FIG. 2 is the detail logic circuit of counting logic 42.
FIG. 3 is the detail logic circuit of the actual implemented version of tuning cycle control 26.

COUNTING LOGIC 42 (FIG. 2)

Counting logic 42 comprises a series of interconnected flip flops producing timing pulses for the tuning system. It is driven by a 2MHz clock 45 and, by successive division, develops various timing pulses. The signal $Q_F$ establishes a fixed reference frequency for phase comparator 40. The $\phi_2$ timing pulse resets the LOF counters when the system is in the tuning window mode. The signal at $Q_G$, operating through NAND 273 and in conjunction with the MIS signal, establishes the count interval for asynchronous sampling to establish the window. $\overline{\phi}_1$ establishes the compare interval. LP at the output of NOR 278 enables a series of NOR gates in counter preset 47 to permit loading of the preset information into the LOF counters and the output of NAND 273 supplies the count enable pulse.

A 2MHz pulse train from clock 45 drives a divide-by-32 counter 262. The output of the counter is supplied to the clock terminal of a divide-by-128 counter 264. Both counters may consist of suitably interconnected flip flops. A signal DE$p$ (divided-down-equality pulse) is coupled to the reset terminals of counters 262 and 264.

$Q_D$, $Q_E$, $Q_F$ and $Q_G$ of counter 264 represent outputs corresponding respectively to the input being divided by 16, 32, 64 and 128. $Q_D$ is coupled to a first input of a NAND 266; $Q_E$ to a first input of a NAND 270 and through an Inverter 268 to a second input of NAND 266; $Q_F$ to a third input of NAND 266 and to a first input of a NOR 272; and $Q_G$ to the fourth input of NAND 266, the second input of NAND 270 and a first input of a NAND 273. NAND 270 is coupled to the second input of NOR 272 whose output determines signal $\overline{\phi}_1$. NAND 266 is coupled to the first input of a NOR 274 and develops signal $\phi_2$. $Q_F$ supplies the 1KHz reference for phase detector 40 in FIG. 4.

The mode identification signal (MIS) from the tuning cycle control in FIG. 3 is supplied to the second input of NAND 273, and through an Inverter 276 to the second input of NOR 274. NOR 274 supplies one input of a NOR 278, the other input being supplied an E$p$ pulse through an Inverter 277. The output of NAND 278 is the load preset signal LP.

TUNING CYCLE CONTROL 26 (FIG. 3)

Tuning cycle control 26 determines the operational sequencing of the system in response to either a CCI signal upon entry of a channel number or an IE$p$ signal indicating that system tuning is outside the range defined by the window. Essentially the tuning cycle control is a plurality of flip flops interconnected as a counter whose states provide various timing intervals developed from clock 24.

The system initially obtains ramp direction information from the phase comparator (while inhibiting PLL operation), drives the ramp at full speed until an "overshoot" condition is detected and then lets the PLL operate for a sufficient time to assure single frequency tuning. The ramp drive is essentially latched up in one direction until the correct frequency has been passed which indicates system tuning is close to the desired frequency. Then the PLL is enabled and allowed to operate for the allotted time period before the system is released to its tuning window mode. (It may be noted that the term "full ramp" or "100% ramping" refers to supplying a continuous (D.C.) ramp control voltage. In PLL operation, the phase comparator delivers a pulsed ramp control voltage with a relatively low duty cycle.)

Clock 24 supplies 60Hz to a first input of a NAND 290, its other input being enabled from the output of an RS FF 325. Ramp control voltages from the phase comparator NAND's 342 and 346 (FIG. 4) are supplied respectively, to the inputs of a NAND 348, a first input each of NOR's 368, 370, 388, 394 and directly, and through a delay, to first and second inputs each of NOR's 352 and 350. An Inverter 387 supplies the last inputs of NOR's 388 and 394. An Inverter 366 supplies the remaining inputs of NOR's 368 and 370, which in turn supply an RS FF 375 comprising cross connected NOR's 372 and 374. An Inverter 380 is coupled to the remaining inputs of NOR's 382, 384 and 350 and 352. The outputs of NOR's 384 and 388 and of NOR's 382 and 394, respectively supply the inputs of NOR's 386 and 396, the outputs of which supply the $R_U$ and $R_D$ signals. NOR's 350 and 352 supply both inputs of a NOR 354.

The output of NOR 354 is coupled to a first input of NAND 296. The output of NAND 348 is coupled to an input of a NAND 292. The outputs of NAND's 290 and 292 are coupled, respectively, to second and third inputs of a NAND 296, its last input being supplied from a NAND 294. NAND 296 drives FF 298 in counter 301. Q of FF 298 is coupled to a first input of a NOR 310 and $\overline{Q}$ to a first inut of NOR's 312 and 314 and C of FF 300. Q of FF 300 is coupled to a second input of NOR 312, and $\overline{Q}$ to a second input of NOR 314 and to C of FF 302.

Q of FF 302 supplies a first input of a NOR 320, $\overline{Q}$ supplies C of FF 304 and a first input of a NAND 316 and a NOR 318. Q of FF 304 is coupled to second inputs of NOR's 318 and 320. $\overline{Q}$ of FF 304 is coupled to C of FF 306 and to a second input of NAND 316. Q of FF 306 is coupled to the third input of NOR 318, and $\overline{Q}$ is coupled to third inputs each of NOR 320 and NAND 316. The reset terminals of FF's 298, 300, 302, 304, and 306 and a first input of a NOR 324 are coupled to the output of a NAND 308 having an IE$p$ signal input from channel number comparator 56 and a CCI signal from channel number generator 20 (both in FIG. 1).

The output of NOR 320 carries the MIS signal which is coupled to a first input of a NOR 326 and to a second input of a NOR 324 and to a number of inputs in the other Figures. NOR 318 supplies a first input of a NOR 322, which is cross coupled with NOR 324 to form an RS flip flop 325, which is coupled to a second input of NOR 326, a second input of NAND 290 and to Inverter 387. NAND 316 supplies the remaining inputs of NOR's 310, 312, and 314. NOR 312 is coupled to a second input of NAND 292 and to Inverter 366. NOR 310 is coupled to a second first input of NAND 294. E$p$ is supplied directly, and via a flip flop 328, to the remaining inputs of NOR 326, the DE$p$ output of which is coupled to the last input of NAND 294. The DE$p$ signal is also supplied to the phase comparator and counting logic.

NOR's 350, 352 and 354 provide the "overshoot" detection function for indicating when system tuning has passed the desired point during full ramping. NOR's 368 and 370, in conjunction with RS FF 375 and NOR's 382 and 384 provide the mechanism driving the ramp fully in the desired direction. When NOR's 382 and 384 are enabled by Inverter 380 being at 0 the ramp control signal NOR's 388 and 394 are inhibited. RS FF 325 enables NOR's 388 and 394 as counter 301 is advanced from its state 4 to state 15 to carry out PLL pulsed ramping. NAND 316 and NOR 318 are decoders for the counter states, as are NOR's 310, 312 and 314 with the latter also directing counter state changes. NAND's 290–296 perform the changes. NOR 320 produces the MIS signal based upon the states of FF's 302–306 in the counter which is timed from the 0 state to state 15 of counter 301.

The counter flip flops have a total of 32 states, with state 0 being the reset. NOR 310 decodes state 0 and enables NAND 294. During this state the DE$p$ pulse resets the counters in counting logic 42, resets the phase comparator and advances counter 301 from 0 to state 1.

NOR 312 detects state 1 and enables NAND 292 to subsequently advance the counter to state 2 and, through Inverter 366, enables directional NOR's 368 and 370 causing appropriate setting of RS FF 375 to supply full ramp control voltage. The ramp direction information is received from the phase comparator. In state 2, NOR 310 again enables NAND 294. The DE$p$ signal is again produced, resetting the counting logic and the phase comparator and advancing counter 301 to state 3.

NOR 314 detects state 3 of counter 301 and enables the ramp override NOR's 382 and 384 and the overshoot detection NOR's 350 and 352 to generate full ramp tuning voltage and to detect passing the correct numbers in the channel number comparator, which indicates system tuning has gone beyond the desired frequency. When this occurs, counter 301 is advanced to state 4 by NOR 354 activating NAND 296.

NOR 318 detects state 4 and sets RS FF 325 to maintain NAND 290 enabled for counting and for enabling the normal ramp control signal NOR's 388 and 394. Counter 301 is advanced from state 4 to state 16 by the 60Hz pulses from clock 24, providing an approximate 200ms period during which PLL single frequency tuning is accomplished. The period is sufficiently long to bring the system to the frequency corresponding to any FCC allocated channel. When state 16 is reached, NOR 320 resets RS FF 325, terminating further clock pulses to counter 301.

Figure 4:
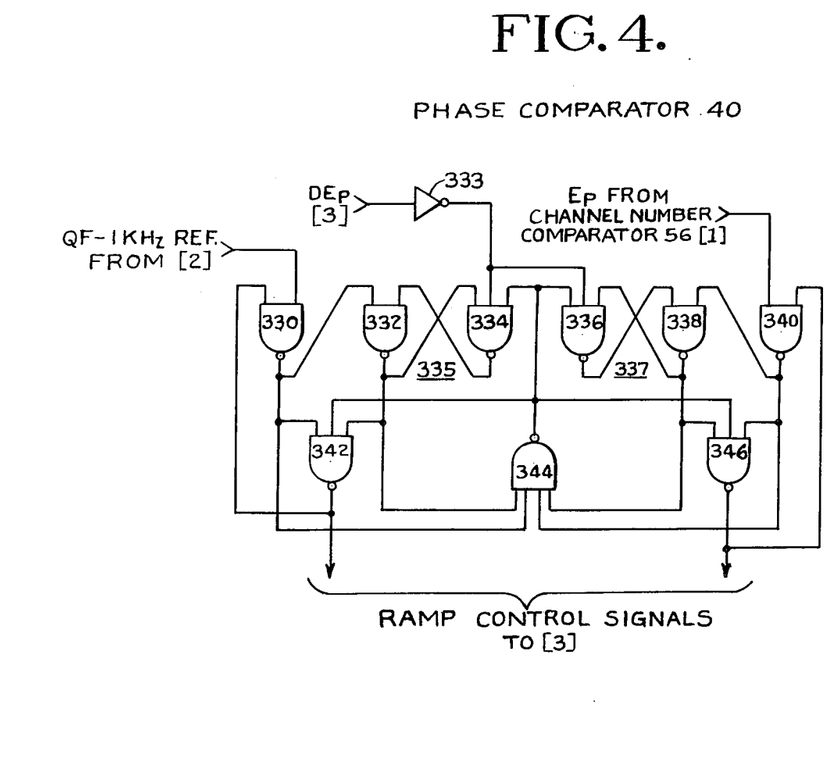
FIG. 4 is the detail logic circuit of phase comparator 40.

PHASE COMPARATOR 40 (FIG. 4)

The phase comparator determines whether the LOF is above or below the desired frequency. The timing signal of counting logic counter is a 1KHz fixed frequency pulse train which is used as the phase comparator reference frequency. Its other input is the E$p$ signal which is a series of pulses produced by the channel number comparator indicating equality between the desired channel number and derived channel number. As described, while the phase comparator continues to operate, the PLL is inhibited during the tuning window mode and during full ramping. The phase comparator itself is well-known in the art; one manufactured by Motorola under designation MC4044 is logically equivalent, although the voltage levels are not correct for this application.

The Q$_F$ output of counting logic counter 264 (FIG. 2) is coupled to a first input of a NAND 330, the output of which connects to a first input each of NAND's 342 and 344 and the input of an RS FF 335 comprising cross coupled NAND's 332 and 334. Signal E$p$ from the channel number comparator (FIG. 1) is coupled to a first input of a NAND 340, the output of which is coupled to a first input of a NAND 346, a second input of NAND 344 and to the input of RS FF 337 comprising cross connected NAND's 336 and 338. Signal DE$p$ is coupled through an Inverter 333 to a second input each of NAND's 334 and 336.

The output of RS FF 337 is coupled to a second input of NAND 346 and to a third input of NAND 344. The output of RS FF 335 is coupled to a second input of NAND 342 and a fourth input of NAND 344. The output of NAND 344 is coupled to the remaining inputs of NAND's 334, 336, 342, and 346. NAND 346 is coupled to the last input of NAND 340 and NAND 342 to the last input of NAND 330. The outputs of NAND's 342 and 346 supply the ramp turn-on or control signals to tuning cycle control 26 (FIG. 3). If the reference signal frequency is greater than the frequency of E$p$, NAND 342 sends a ramp signal to adjust the tuning voltage. The DE$p$ signal resets the phase comparator so that it starts from the correct state and gives a correct direction signal.

Figure 5:
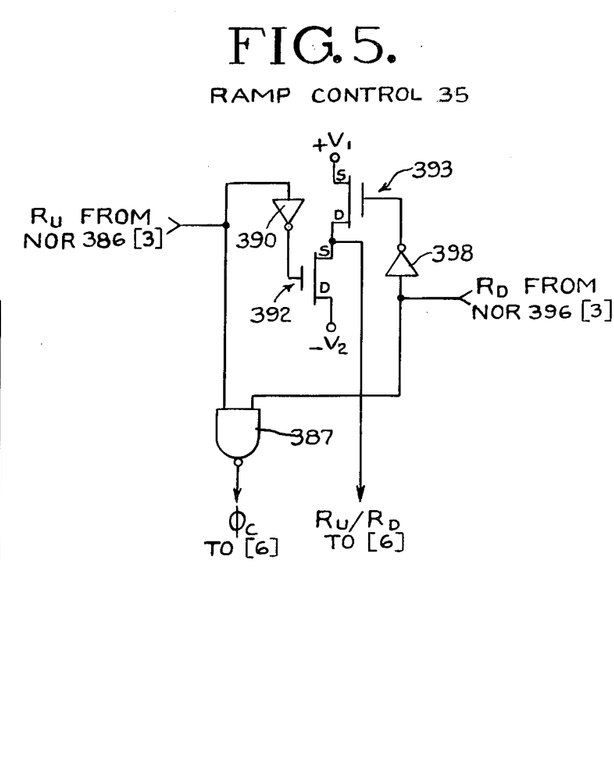
FIG. 5 is the detail logic circuit of ramp control circuit 35.

RAMP CONTROL 35 (FIG. 5)

The phase comparator is fully described under the designation MC4344.MC4044 in a Motorola publication entitled "Phase Lock Loop Data Library" printed in the USA in November 1972. The connection of the phase comparator according to the instant specifications will produce the described results. A characteristic of such a phase comparator is that it occasionally produces "glitches" or small voltage spikes while internally going through its state changes. To preclude interpretation of such glitches as direction information, the delays to NOR's 350 and 352 are included.

Ramp control 35 operates in conjunction with a voltage divider circuit to adjust the LOF through tuning voltage source 36, and thereby change system tuning. The ramp control signal is directly dependent on the output of phase comparator 40 as made available to it by tuning cycle control 26. The ramp control is only active during 100% ramping and the single frequency mode, the AFC circuit making minor adjustments to the tuning voltage control during the tuning window mode. NOR's 386 and 396 from the tuning cycle control respectively supply the two inputs of a NAND 387 and, through Inverters 390 and 398 respectively supply the gate electrodes of FET's 392 and 393.

A source of +5V is coupled to the source electrode of FET 393, and −12V is coupled to the drain electrode of FET 392. The drain electrode of FET 393 and source electrode of FET 392 are coupled together and the ramp control signals $R_U/R_D$ taken from this junction and applied to the tuning voltage source in FIG. 6. The actual ramp control signal is taken from the common terminal of the two FET's and corresponds approximately to $+V_1$ for a $R_D$ signal, $-V_2$ for a $R_U$ signal and an open circuit in its third state. The ramp signal is supplied to one input of an OTA in the tuning voltage source (FIG. 6) along with a timing signal obtained from NAND 387, indicating occurrence of a ramp signal. Thus ramp control 35 appropriately enables tuning voltage source 36 when a $R_U$ or $R_D$ signal is produced.

Figure 6:
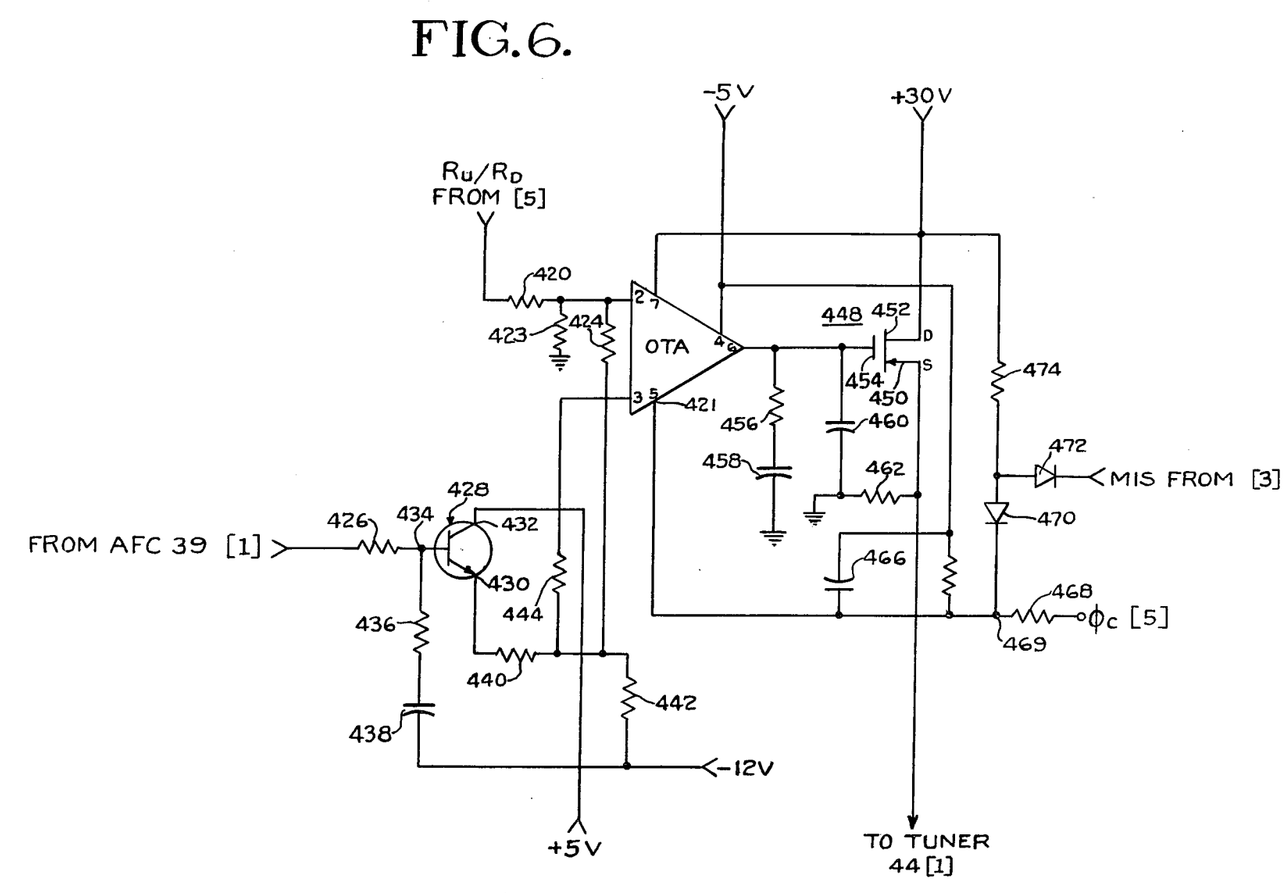
FIG. 6 shows the detail of the circuitry for tuning voltage source 36.

TUNING VOLTAGE SOURCE 36 (FIG. 6)

The $R_U/R_D$ signal from the ramp control (FIG. 5) is coupled to a resistor divider consisting of a resistor 420 and a grounded resistor 423. Their junction is connected to terminal 2 of an operational transconductance amplifier (OTA) 422 functioning as a voltage controlled current source. RCA No. CA3080 is the actual OTA used. A −12V source also is connected through resistors 442 and 424 to this terminal. A −5V source is connected to the terminal 4 of OTA 422. A parallel combination of a resistor 464 and a capacitor 466, is connected between OTA terminals 4 and 5. Output terminal 6 supplies a grounded capacitor 460 connected in parallel with the series connection of a resistor 456 and a capacitor 458, and the gate of an FET 448. +30V is connected to terminal 7 of OTA 422, to the source electrode 452 of FET 448 and through a resistor 474 to the junction of the anodes of a pair of diodes 470 and 472. The FET source electrode 450 is connected to ground through a resistor 462 and supplies the DC tuning voltage to the tuner (FIG. 1). $\phi_C$ from the ramp control (FIG. 5) is supplied through a resistor 468 to the cathode of diode 470 and terminal 5 of OTA 422. The MIS signal from NOR 320 (FIG. 3) supplies the cathode of diode 472.

Voltage from AFC 39 (FIG. 1) is applied through a resistor 426 to the base 434 of a common-collector transistor 428, which functions as a low pass buffer lever shifter stage. Base 434 is coupled through series connected resistor 436 and capacitor 438 to a source of −12V. Collector 432 is supplied with +5V and emitter 430 is connected to −12V through a resistor 440 and resistor 442. A resistor 444 is connected from their junction to terminal 3 of the OTA.

The tuning voltage source comprises an OTA for supplying appropriate current under control of ramp control 35. The AFC circuit is also coupled, through a buffer level shifter amplifier, to the OTA for exercising tuning voltage control during the tuning window mode. (The MIS signal controls defeat of the AFC during single frequency tuning mode.) Timing signal $\phi_C$ (derived from ramp control 35 in FIG. 4) enables the OTA when a $R_U/R_D$ signal is produced. During PLL operation the OTA functions as a pulse width modulated sample and hold circuit and $\phi_C$ acts as a gating control for the sample and hold. During AFC operation OTA 422 is acting as a linear amplifier and is on all the time.

What has been described is a novel system with fast channel acquisition time. While the invention has been described in the environment of a two-mode tuning system with an initial single frequency mode and a subsequent tuning window mode, it should not be so limited.

It is recognized that numerous changes or modifications may be made in the described invention without departing from its true scope and that the invention is to be limited only as defined in the claims.

What is claimed is:

1. An all-electronic tuning system for rapidly tuning to any television channel by channel number comprising:
    a tuner including a voltage controllable oscillator;
    ramp means capable of supplying tuning voltage to said oscillator for adjusting system tuning at a normal rate and at a second higher rate;
    counting means deriving channel tuning information by interrogation of the frequency of said oscillator;
    channel number selection means for generating desired channel tuning information;
    channel information comparison means comparing derived channel tuning information with desired channel tuning information and controlling operation of said ramp means at said normal rate in accordance with the result of the comparison; and
    tuning cycle control means, for initially controlling said ramp means to drive said tuner at said higher rate until system tuning is driven past the frequency corresponding to the desired channel number at which time said comparison means assumes control of said ramp means at said normal rate.

2. A tuning system as set forth in claim 1 wherein said channel information comparison means includes:
    a phase comparator;
    clock means for producing a reference frequency for said phase comparator;
    said channel information comparison means producing comparison pulses for said phase comparator, said phase comparator controlling said ramp means at said normal rate.

3. A tuning system as set forth in claim 2, wherein said tuning cycle control means includes means for overriding said phase comparator.

4. A tuning system as set forth in claim 3, wherein said ramp means supply directional tuning voltages, said tuning cycle control means including means determining directional information from said phase comparator for appropriate directional control of said ramp means.

5. A tuning system as set forth in claim 4, wherein said tuning cycle control means include a counter having a plurality of states and logic circuitry for sequentially:
 a. interrogating said phase comparator for directional information;
 b. overriding said phase comparator and controlling said ramp means to adjust system tuning at said second higher rate;
 c. detecting when system tuning passes the frequency corresponding to the desired channel number and
 d. re-establishing phase comparator control of said ramp means.

6. An all-electronic tuning system for rapidly tuning to any television channel comprising:
 a tuner including a voltage controllable oscillator;
 a phase comparator;
 a source of reference frequency coupled to said phase comparator;
 ramp means capable of supplying tuning voltage to said oscillator for adjusting system tuning at a normal rate under control of said phase comparator and at a second higher rate;
 counter means deriving channel tuning information by counting the frequency of said oscillator;
 channel number selection means for generating desired channel numbers;
 a channel number comparator comparing derived channel numbers with desired channel tuning information and producing comparison pulses;
 said phase comparator comparing said reference frequency and said comparison pulses for controlling operation of said ramp means to adjust system tuning at said normal rate in accordance with their respective frequency and phase, and
 tuning cycle control means, for overriding said phase comparator and controlling said ramp means to adjust system tuning at said higher rate until system tuning is driven past the frequency corresponding to the desired channel number at which time said phase comparator assumes control of said ramp means at said normal rate.

7. A tuning system as set forth in claim 6, wherein said ramp means supply directional tuning voltages and wherein said tuning cycle control means includes means deriving directional information from said phase comparator for application to said ramp means.

8. A tuning system as set forth in claim 7, wherein said tuning cycle control means includes a clock controlled counter having a plurality of states and logic circuitry; said tuning cycle control means operating upon energization to sequentially;
 a. determine directional information from said phase comparator;
 b. override said phase comparator and control said ramp means to adjust system tuning at said second higher rate;
 c. detect when system tuning passes the frequency corresponding to the desired channel number, and
 d. re-establish phase comparator control of said ramp means.

* * * * *

UNITED STATES PATENT OFFICE
CERTIFICATE OF CORRECTION

Patent No. 4,070,629  Dated January 24, 1978

Inventor(s) Richard G. Merrell

It is certified that error appears in the above-identified patent and that said Letters Patent are hereby corrected as shown below:

Insert the attached Columns 11 thru 14 after Column 10, respectively.

Signed and Sealed this

*Twenty-seventh* Day of *June 1978*

[SEAL]

*Attest:*

RUTH C. MASON
*Attesting Officer*

DONALD W. BANNER
*Commissioner of Patents and Trademarks*

RAMP CONTROL 35 (FIG. 5)

The phase comparator is fully described under the designation MC4344.MC4044 in a Motorola publication entitled "Phase Lock Loop Data Library" printed in the USA in November 1972. The connection of the phase comparator according to the instant specifications will produce the described results. A characteristic of such a phase comparator is that it occasionally produces "glitches" or small voltage spikes while internally going through its state changes. To preclude interpretation of such glitches as direction information, the delays to NOR's 350 and 352 are included.

Ramp control 35 operates in conjunction with a voltage divider circuit to adjust the LOF through tuning voltage source 36, and thereby change system tuning. The ramp control signal is directly dependent on the output of phase comparator 40 as made available to it by tuning cycle control 26. The ramp control is only active during 100% ramping and the single frequency mode, the AFC circuit making minor adjustments to the tuning voltage control during the tuning window mode. NOR's 386 and 396 from the tuning cycle control respectively supply the two inputs of a NAND 387 and, through Inverters 390 and 398 respectively supply the gate electrodes of FET's 392 and 393.

A source of +5V is coupled to the source electrode of FET 393, and −12V is coupled to the drain electrode of FET 392. The drain electrode of FET 393 and source electrode of FET 392 are coupled together and the ramp control signals $R_U/R_D$ taken from this junction and applied to the tuning voltage source in FIG. 6. The actual ramp control signal is taken from the common terminal of the two FET's and corresponds approximately to $+V_1$ for a $R_D$ signal, $-V_2$ for a $R_U$ signal and an open circuit in its third state. The ramp signal is supplied to one input of an OTA in the tuning voltage source (FIG. 6) along with a timing signal obtained from NAND 387, indicating occurrence of a ramp signal. Thus ramp control 35 appropriately enables tuning voltage source 36 when a $R_U$ or $R_D$ signal is produced.

TUNING VOLTAGE SOURCE 36 (FIG. 6)

The $R_U/R_D$ signal from the ramp control (FIG. 5) is coupled to a resistor divider consisting of a resistor 420 and a grounded resistor 423. Their junction is connected to terminal 2 of an operational transconductance amplifier (OTA) 422 functioning as a voltage controlled current source. RCA No. CA3080 is the actual OTA used. A −12V source also is connected through resistors 442 and 424 to this terminal. A −5V source is connected to the terminal 4 of OTA 422. A parallel combination of a resistor 464 and a capacitor 466, is connected between OTA terminals 4 and 5. Output terminal 6 supplies a grounded capacitor 460 connected in parallel with the series connection of a resistor 456 and a capacitor 458, and the gate of an FET 448. +30V is connected to terminal 7 of OTA 422, to the source electrode 452 of FET 448 and through a resistor 474 to the junction of the anodes of a pair of diodes 470 and 472. The FET source electrode 450 is connected to ground through a resistor 462 and supplies the DC tuning voltage to the tuner (FIG. 1). $\phi_C$ from the ramp control (FIG. 5) is supplied through a resistor 468 to the cathode of diode 470 and terminal 5 of OTA 422. The MIS signal from NOR 320 (FIG. 3) supplies the cathode of diode 472.

Voltage from AFC 39 (FIG. 1) is applied through a resistor 426 to the base 434 of a common-collector transistor 428, which functions as a low pass buffer lever shifter stage. Base 434 is coupled through series connected resistor 436 and capacitor 438 to a source of −12V. Collector 432 is supplied with +5V and emitter 430 is connected to −12V through a resistor 440 and resistor 442. A resistor 444 is connected from their junction to terminal 3 of the OTA.

The tuning voltage source comprises an OTA for supplying appropriate current under control of ramp control 35. The AFC circuit is also coupled, through a buffer level shifter amplifier, to the OTA for exercising tuning voltage control during the tuning window mode. (The MIS signal controls defeat of the AFC during single frequency tuning mode.) Timing signal $\phi_C$ (derived from ramp control 35 in FIG. 4) enables the OTA when a $R_U/R_D$ signal is produced. During PLL operation the OTA functions as a pulse width modulated sample and hold circuit and $\phi_C$ acts as a gating control for the sample and hold. During AFC operation OTA 422 is acting as a linear amplifier and is on all the time.

What has been described is a novel system with fast channel acquisition time. While the invention has been described in the environment of a two-mode tuning system with an initial single frequency mode and a subsequent tuning window mode, it should not be so limited.

It is recognized that numerous changes or modifications may be made in the described invention without departing from its true scope and that the invention is to be limited only as defined in the claims.

What is claimed is:

1. An all-electronic tuning system for rapidly tuning to any television channel by channel number comprising:
    a tuner including a voltage controllable oscillator;
    ramp means capable of supplying tuning voltage to said oscillator for adjusting system tuning at a normal rate and at a second higher rate;
    counting means deriving channel tuning information by interrogation of the frequency of said oscillator;
    channel number selection means for generating desired channel tuning information;
    channel information comparison means comparing derived channel tuning information with desired channel tuning information and controlling operation of said ramp means at said normal rate in accordance with the result of the comparison; and
    tuning cycle control means, for initially controlling said ramp means to drive said tuner at said higher rate until system tuning is driven past the frequency corresponding to the desired channel number at which time said comparison means assumes control of said ramp means at said normal rate.

2. A tuning system as set forth in claim 1 wherein said channel information comparison means includes:
    a phase comparator;
    clock means for producing a reference frequency for said phase comparator;
    said channel information comparison means producing comparison pulses for said phase comparator, said phase comparator controlling said ramp means at said normal rate.

3. A tuning system as set forth in claim 2, wherein said tuning cycle control means includes means for overriding said phase comparator.

4. A tuning system as set forth in claim 3, wherein said ramp means supply directional tuning voltages, said tuning cycle control means including means determining directional information from said phase comparator for appropriate directional control of said ramp means.

5. A tuning system as set forth in claim 4, wherein said tuning cycle control means include a counter having a plurality of states and logic circuitry for sequentially:
   a. interrogating said phase comparator for directional information;
   b. overriding said phase comparator and controlling said ramp means to adjust system tuning at said second higher rate;
   c. detecting when system tuning passes the frequency corresponding to the desired channel number and
   d. re-establishing phase comparator control of said ramp means.

6. An all-electronic tuning system for rapidly tuning to any television channel comprising:
   a tuner including a voltage controllable oscillator;
   a phase comparator;
   a source of reference frequency coupled to said phase comparator;
   ramp means capable of supplying tuning voltage to said oscillator for adjusting system tuning at a normal rate under control of said phase comparator and at a second higher rate;
   counter means deriving channel tuning information by counting the frequency of said oscillator;
   channel number selection means for generating desired channel numbers;
   a channel number comparator comparing derived channel numbers with desired channel tuning information and producing comparison pulses;
   said phase comparator comparing said reference frequency and said comparison pulses for controlling operation of said ramp means to adjust system tuning at said normal rate in accordance with their respective frequency and phase, and
   tuning cycle control means, for overriding said phase comparator and controlling said ramp means to adjust system tuning at said higher rate until system tuning is driven past the frequency corresponding to the desired channel number at which time said phase comparator assumes control of said ramp means at said normal rate.

7. A tuning system as set forth in claim 6, wherein said ramp means supply directional tuning voltages and wherein said tuning cycle control means includes means deriving directional information from said phase comparator for application to said ramp means.

8. A tuning system as set forth in claim 7, wherein said tuning cycle control means includes a clock controlled counter having a plurality of states and logic circuitry; said tuning cycle control means operating upon energization to sequentially;
   a. determine directional information from said phase comparator;
   b. override said phase comparator and control said ramp means to adjust system tuning at said second higher rate;
   c. detect when system tuning passes the frequency corresponding to the desired channel number, and
   d. re-establish phase comparator control of said ramp means.

* * * * *